United States Patent [19]
Ulczynski et al.

[11] Patent Number: 5,897,924
[45] Date of Patent: Apr. 27, 1999

[54] PROCESS FOR DEPOSITING ADHERENT DIAMOND THIN FILMS

[75] Inventors: Michael J. Ulczynski, Okemos; Donnie K. Reinhard, East Lansing; Jes Asmussen, Okemos, all of Mich.

[73] Assignee: Board of Trustees operating Michigan State University, East Lansing, Mich.

[21] Appl. No.: 08/825,429

[22] Filed: Mar. 28, 1997

Related U.S. Application Data

[63] Continuation of application No. 08/494,410, Jun. 26, 1995, abandoned.

[51] Int. Cl.$^6$ .............................. B05D 3/06; C23C 16/26
[52] U.S. Cl. ........................ 427/577; 427/575; 427/573; 427/249; 427/109; 427/299
[58] Field of Search ................................ 427/577, 573, 427/575, 249, 299, 109; 423/446; 65/60.6

[56] References Cited

U.S. PATENT DOCUMENTS

| | | |
|---|---|---|
| 4,925,701 | 5/1990 | Jansen et al. . |
| 5,028,451 | 7/1991 | Ito et al. . |
| 5,145,711 | 9/1992 | Yamazaki et al. . |
| 5,180,571 | 1/1993 | Hosoya et al. . |
| 5,183,685 | 2/1993 | Yamazaki . |
| 5,185,179 | 2/1993 | Yamazaki et al. . |
| 5,188,862 | 2/1993 | Itatani et al. . |
| 5,200,231 | 4/1993 | Bachmann et al. . |
| 5,204,144 | 4/1993 | Cann et al. . |
| 5,230,931 | 7/1993 | Yamazaki et al. . |
| 5,240,749 | 8/1993 | Chow . |
| 5,242,711 | 9/1993 | DeNatale et al. . |
| 5,243,170 | 9/1993 | Maruyama et al. . |
| 5,260,106 | 11/1993 | Kawarada et al. . |
| 5,270,077 | 12/1993 | Knemeyer et al. . |
| 5,286,524 | 2/1994 | Slutz et al. . |
| 5,298,286 | 3/1994 | Yang et al. . |
| 5,302,231 | 4/1994 | Bovenkerk et al. . |
| 5,311,103 | 5/1994 | Asmussen et al. . |

FOREIGN PATENT DOCUMENTS 5-163572  6/1993  Japan .

OTHER PUBLICATIONS

Liou et al, J. Mater. Res. vol. 5 No. 11, Nov. 1990, pp. 2305–2312.
Shing et al, Thin Solid Films, 212 (1992) pp. 150–155.
Bachmann et al, Diamond and Related Materials, 1. (1991) pp. 1–12.
Chen et al, Surface and Coatings Technology, 54155 (1992) pp. 368–373.
Chen et al, Scripta Metallurgica et Materialia, vol. 31, No. 6, (1994) pp. 775–780.
Pierson, Handbook of Chemical Vapor Deposition (CVD), Principles, Technology and Applications, Noyes Publications, 1992, pp. 168–173.
Barnes et al, Appl. Phys. lett. 62(1) Jan. 1993, pp. 37–39.
Katoh et al, Jpn. J. Appl. Phys. vol. 33 (1994) pp. L94–96.
Chen et al, J. Appl. Phys 74(7) Oct. 1993, pp. 4483–4488.
Harris, D. C., Proc. SPIE, 2286 pp. 218–228 (1994) No month data!.
Ong, T.P., et al., Appl. Phys. Lett., 55(20) pp. 2063–2065 (1989) No month data!.
Pickrell, D.J., et al., J. Mater. Res. 6 pp. 1264–1276 (1991) No month data!.
Muranaka, Y., et al., J. Vac. Sci. Technol. A 9 pp. 76–84 (1991) No month data!.
Joseph, A., et al., 2nd International Conference on the Applications of Diamond Films and Related Materials, Eds. M. Yoshikawa, et al., pp. 429–432 MYU Tokyo (1993) No month data !.
Nariman, K. E., et al., Chem. Mater. 3 p. 391–394 (1991) No month data !.
Ulczynski, M. J., et al., Advances in New Diamond Science and Technology, Eds. S. Saito, et al., MYU, Tokyo (1994) pp. 41–44 No month data !.
Masood, A., et al., J. Electrochem. Soc., 138 L67–L68 (1991) No month data!.
Grot, S. A., et al.,Diamond Thin–Film Recessed Gate Field–Effect Transistors Fabricated by Electron Cyclotron Resonance Plasma Etching vol. 13, No. 9 pp. 462–464 (1992) No month data!.

*Primary Examiner*—Roy V. King
*Attorney, Agent, or Firm*—Ian C. McLeod

[57] ABSTRACT

A process for depositing an adherent polycrystalline diamond thin film on a glass substrate, by chemical vapor deposition (CVD) at 1 to 15 torr and low temperatures of the substrate of between about 350 to 600° C. using hydrogen and methane and optionally carbon dioxide. The substrate has diamond particles deposited on it or is polished with diamond particles prior to CVD. The process produces films which are clear and adherent.

7 Claims, 3 Drawing Sheets

PROCESS FOR DEPOSITING ADHERENT DIAMOND THIN FILMS

This application is a continuation of application Ser. No. 08/494,410 filed on Jun. 26, 1995, now abandoned.

BACKGROUND OF THE INVENTION (2) Field of the Invention

The present invention relates to a plasma assisted chemical vapor deposition (CVD) process for the preparation of an adherent polycrystalline diamond thin film on a substrate, preferably silicon or glass, using relatively low temperatures (less than 600° C.). In particular, the process relates to particular conditions for producing the adherent diamond thin film.

(2) Description of Related Art

Diamond has an exceptionally wide optical transmission window, is resistant to chemical attack at ordinary temperatures, and is expected to be highly resistant to abrasion and erosion (Harris, D. C., Proc. SPIE, 2286, pp. 218–228 (1994)). Consequently it is of interest as a coating material for other optical materials which are less resistant to hostile environments. The most common optical material is glass; however, diamond film deposition on glass can be problematic. Adhesive diamond films deposited by chemical vapor deposition (CVD) have been reported on quartz, which has a low thermal expansion coefficient (Ong, T. P., et al., Appl. Phys. Lett., 55 2063–2065 (1989); Pickrell, D. J., et al., J. Mater. Res. 6 1264–1276 (1991); Muranaka, Y., et al., J. Vac. Sci. Technol. A, 9 76–84 (1991); and Joseph, A., et al., 2nd International Conference on the Applications of Diamond Films and Related Materials, Eds. M. Yoshikawa, et al., 429–432, MYU, Tokyo (1993)). For glasses with lower softening point temperatures and larger thermal expansion coefficients than pure silica, such as borosilicate glasses, adhesion of CVD diamond films has been reported to be a problem (Nariman, K. E., et al., Chem. Mater. 3 391–394 (1991)).

Diamond is of interest for electronic packaging because of its combination of thermal, electrical and mechanical properties. Diamond is already being used as a substrate material onto which heat producing electronic components are attached (Harris, D. C., Proc. SPIE 2286 218–228 (1994); and Ong, T. P., et al., Appl. Phys. Lett. 55 2063–2065 (1989)). In such cases, the high thermal conductivity of diamond combines with its high electrical resistivity and low dielectric constant to provide high-performance heat sinks for microwave integrated circuits, power device modules, and multichip modules (Pickrell, D. J., et al., J. Mater. Res. 6 1264–1276 (1991); and Muranaka, Y., et al., J. Vac. Sci. Technol. A. 9 76–84 (1991)). However, diamond is also under consideration as an over-coating layer on microelectronic components. One potential advantage of diamond films on integrated circuits is as a superior passivation layer. In previous work, for example, hot-filament chemical vapor deposition (CVD) was used to deposit a 2 μm thick diamond film on a silicon wafer containing circuitry including linear amplifiers and resistor elements used for thermal transfer printing devices (Joseph A., et al., 2nd International Conference on the Applications of Diamond Films and Related Materials, Eds., M. Yoshikawa, et al., 429–432, MYU, Tokyo (1993)). It was noted that the resulting devices exhibited superior lifetime in that the diamond coated circuits did not exhibit failure due to abrasion of the resistor elements by the paper.

However, the diamond deposition temperature of 850° C. for this example is too high for conventional microelectronics which use aluminum metallization. overlay diamond films have also been proposed for improved thermal management of local hot spots in which, for example, diamond would be used as the dielectric material to fill the gap between source-gate and gate-drain regions of high electron mobility transistors (Nariman, K. E., et al., Chem. Mater. 3 391–394 (1991)). In order to implement such a device, low temperature deposition of diamond is required.

The prior art in chemical vapor deposition of polycrystalline diamond on various substrates is extensive. U.S. Pat. No. 4,925,701 to Jansen et al describes a process wherein diamond particles are used for seeding a surface to be coated to produce an adherent film on the surface as tested by the adhesive tape method. The films are particularly useful for protecting electronic circuitry on silicon wafers (IC chips) from heat and mechanical damage. Relatively high temperatures above 650° C. were used by Jansen et al which can affect the circuitry on the IC chips. Patents which describe related processes are: U.S. Pat. No. 5,311,103 to Asmussen et al; U.S. Pat. No. 5,302,231 to Bovenkerk et al; U.S. Pat. No. 5,298,286 to Yang et al; U.S. Pat. No. 5,286,524 to Slutz et al; U.S. Pat. No. 5,270,077 to Knemeyer et al; U.S. Pat. No. 5,260,106 to Kawarada et al; U.S. Pat. No. 5,243,170 to Maruvama et al; U.S. Pat. No. 5,242,711 to DeNatale et al; U.S. Pat. No. 5,240,749 to Chow; U.S. Pat. No. 5,200,231 to Bachmann et al; U.S. Pat. No. 5,230,931 to Yamazaki et al; U.S. Pat. No. 5,204,144 to Cann et al; U.S. Pat. No. 5,188,862 to Itatani et al; U.S. Pat. No. 5,185,179 to Yamazaki et al; U.S. Pat. No. 5,183,685 to Yamazaki; U.S. Pat. No. 5,180,571 to Hosova et al; U.S. Pat. No. 5,145,711 to Yamazaki et al; and U.S. Pat. No. 5,028,451 to Ito et al.

It has been found that the films have relatively poor adhesion to a glass containing substrate either as a result of stresses developed between the film and the substrate in thermal cycling or because the film does not bond well to this substrate. The optical transmission properties of the prior art films are relatively difficult to control. There is a need for improvements in plasma assisted CVD of diamond on silicon containing substrates.

OBJECTS

It is therefore an object of the present invention to provide a process which reliably produces an adherent polycrystalline coating on silicon containing substrates, particularly glass and silicon wafers, which can have integrated microcircuits (i.e. IC chips). Further, it is an object of the present invention to provide a process which produces polycrystalline films which have good optical transmission properties. Further still, it is an object of the present invention to provide a process which is relatively economical and easy to perform. These and other objects will become increasingly apparent by reference to the following description and the drawings.

DESCRIPTION OF PREFERRED EMBODIMENTS

Figure 1:
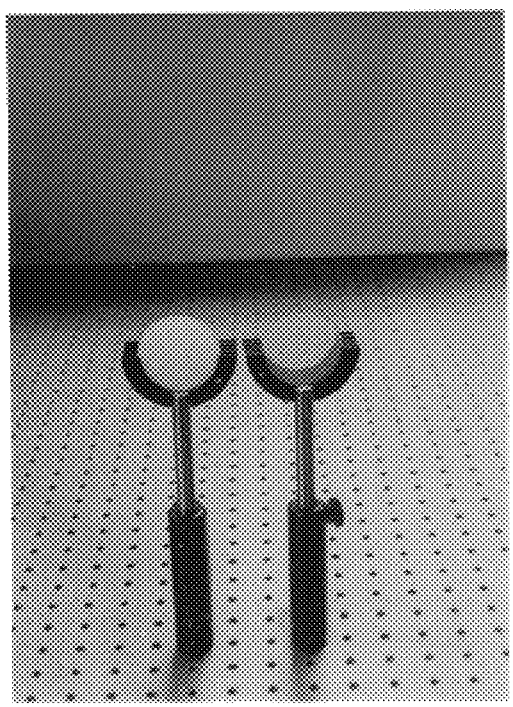
FIG. 1 is a photograph showing visibility through a large grain-size, translucent film on the left, which is compared to visibility through a small grain-size, transparent film on the right.

The present invention relates to a method for depositing an adherent diamond thin film on a substrate by chemical vapor deposition from a plasma, the improvement which comprises: positioning the substrate, which has been polished with diamond particles or uniformly coated with diamond particles between about 0.05 and 1 micron in width, adjacent to the plasma for deposition of the diamond thin film; and creating the plasma at a temperature of the substrate of less than 600° C. containing a mixture of gases consisting essentially of hydrogen, optionally carbon dioxide, and methane at a pressure of between 1 and 15 torr to deposit the diamond thin film on the substrate, wherein the diamond thin film is adherent to the substrate.

The present invention particularly relates to a method for depositing an adherent diamond thin film on a substrate comprising silicon or glass by chemical vapor deposition from a plasma: positioning the substrate, which has been polished with diamond particles or uniformly coated with diamond particles between 0.05 to 1 micron in width, adjacent the plasma for deposition of the diamond thin film; and creating a plasma at a temperature of the substrate of 350–500° C. consisting essentially of hydrogen, carbon dioxide and methane at a pressure of between 1 and 15 torr to deposit the diamond thin film on the substrate, wherein the diamond thin film is adherent to the substrates.

The substrate can be polished with a diamond powder (preferably 0.05 to 1 micron). The substrate can then be subjected to CVD to produce a fine grained film which is more transparent than when the substrate is coated with the diamond particles prior to CVD. Thus the polishing step is preferred. The diamond particles applied to the substrate before CVD have a particle width between about 0.05 and 1 micrometer. This enables the production of the adherent films using the process of the invention. Preferably a photoresist is admixed with the diamond particles such as SHIPLEY 1813, Shipley Marlborough, MA which is a mixture of a resin and a photoactive compound (diazooxide). Many such photoresist materials are well known to those skilled in the art. The diamond particles can also be applied to the surface suspended in an organic liquid, such as isopropanol, which is volatilized from the substrate. Spin-coating is preferred as is known in the art.

The gas composition used in the present invention consists essentially of methane and hydrogen and preferably carbon dioxide, as well. This composition forms adherent and clear diamond thin films at low temperatures between 400–600° C. and 1 to 15 torr. It is believed that the lower thermal stress between the diamond thin film and the substrate which results on cooling contributes to the result.

The mole ratios of the flowing mixed gases are between about 0.90 to 0.99 for hydrogen, 0 to 0.05 for carbon dioxide and 0.01 to 0.05 for methane. The flow rate is preferably 200 SCCM. A flow rate range of 50 SCCM to 500 SCCM can be used. As can be seen, there is always a significant molar excess of hydrogen to maintain reducing conditions in the plasma.

The films produced are generally between about 0.5 and 3.0 micrometers thick. Such films require about 5 to 40 hours to produce on the substrate.

The substrate is preferably a silicon or glassy material, particularly a silicon wafer or borosilicate glass. Glass substrates are difficult to coat.

A positive voltage bias can be applied to the substrate. This enables endless control of film morphology (i.e. crystal size and shape). The bias on the substrate is positive between about 80 and 120 DCV.

The microwaves used to create the plasma are preferably at 2.45 GHz. Other microwave frequencies such as 915 MHz can be used. The power input is preferably 300 to 1500 watts. The preferred apparatus is described in U.S. Pat. No. 5,311,103 to Asmussen et al with a graphite support for the substrate. Numerous other configurations for producing a resonant RF or microwave plasma source can be used as is well known to those skilled in the art.

Microwave plasma-assisted chemical vapor deposition can be used to deposit continuous and adhering diamond films on borosilicate glasses that exhibit 70% optical transmission. Such films require low substrate temperatures, between 400° C. and 600° C., during deposition.

Diamond over-coatings on substrates which contain microelectronic circuitry provide a means for reduction of thermal hot-spots, or act as a superior passivation layer. This invention includes microwave plasma-assisted chemical vapor deposition of diamond on silicon substrates which contain microelectronic devices. Deposition temperatures are compatible with the aluminum metallization technology commonly used in integrated circuit fabrication. Both passive devices (diffused resistors) and active devices (transistors) are successfully coated.

EXAMPLE 1

This example illustrates long-term adhesion of diamond films on glass. The apparatus of FIG. 4 of U.S. Pat. No. 5,311,103 was used.

The substrate was CORNING 7059 glass (Dow Corning, Midland, Michigan) wafer, 2 inches in diameter and 1.1 mm thick. The substrate was seeded by 0.1 micrometer diamond powder suspended in photoresist (SHIPLEY 1813) which was spun onto the wafer. Film deposition was performed in a microwave plasma disk reactor with a 4 inch diameter bell jar at a pressure of 7 torr and with gas flows of 200 sccm hydrogen, 8 sccm carbon dioxide, and 3 sccm methane. Deposition time was 40 hours, the microwave input power was 350 W, and the substrate temperature as measured with an optical pyrometer was 465° C. The resulting film was continuous as documented by microscopy, and was high-quality polycrystalline diamond as documented by Raman analysis.

The average thickness was 1.24 micrometers as determined by weight gain measurements. One year after deposition, the tape-test (performed using 3M Scotch Magic tape, 19 mm wide) still yielded an intact, adhering diamond film on glass.

Using the method of Example 1, diamond was deposited using a low-temperature microwave plasma-assisted CVD method of the present invention. The results are generally described by the inventors in Ulczynski, M. J., et al., Advances in New Diamond Science and Technology, Eds. S. Saito, et al., MYU, Tokyo, (1994). Seeding of the substrates was performed either by a spin-on method as described by Masood et al (Masood, A., et al., J. Electrochem. Soc., 138 L67–L68 (1991)), or by polishing with fine diamond powder. The substrate temperature during deposition was varied between 400° C. and 520° C. as measured by optical pyrometry. Substrates up to 10 cm in diameter have been coated with deposition rates of 1 mg per hour by this method.

The resulting films are generally in a state of compression since the thermal expansion coefficient of the glass substrates is approximately twice that of diamond. Many films have shown good long-term adhesion with, for example, diamond films on both Corning 7059 and PYREX substrates that pass the tape test for adhesion one year after adhesion, and after repeated thermal cycling to 200° C. Other films, however, have shown spontaneous delamination after times ranging from several minutes to several days after removal from the deposition chamber. The most obvious variables affecting adhesion are deposition temperature and film thickness since film stress increases as both of these parameters increase. Long term adhesion is best achieved when film thicknesses are less than 3 μm and deposition temperatures are less than 480° C.

Figure 2:
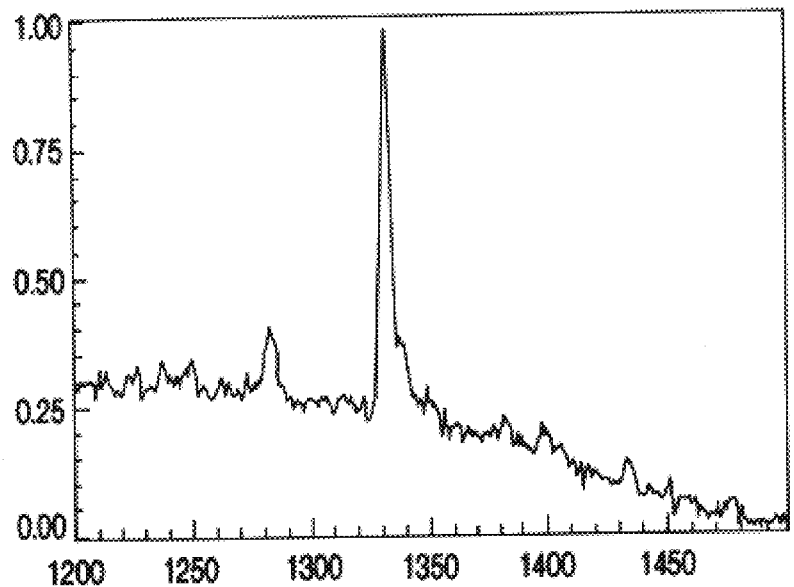
FIG. 2 is a graph showing the Raman spectrum for the transparent film shown in FIG. 1 which shows a characteristic diamond peak at 1332 cm$^{-1}$.

The optical properties of the films are highly dependent on the grain size of the poly-crystalline film. Larger grain films with average grain sizes on the order of a micrometer, are translucent, having the appearance of frosted glass. Objects are clearly visible through such films only if they are directly adjacent to the diamond film. In contrast, smaller grain films, with grain sizes on the order of a quarter-micrometer, are transparent. This difference is illustrated in FIG. 1 in which the optical table features are clearly visible through the small grain film, but not the large grain film. Both films however are high quality diamond as indicated by Raman spectroscopy. A Raman spectra, taken with a 30 μm diameter, 488 nm Argon laser, for the transparent film in FIG. 1 is shown in FIG. 2. The polishing of the glass substrate with the diamond particles resulted in the clear, fine grained films.

Figure 3:
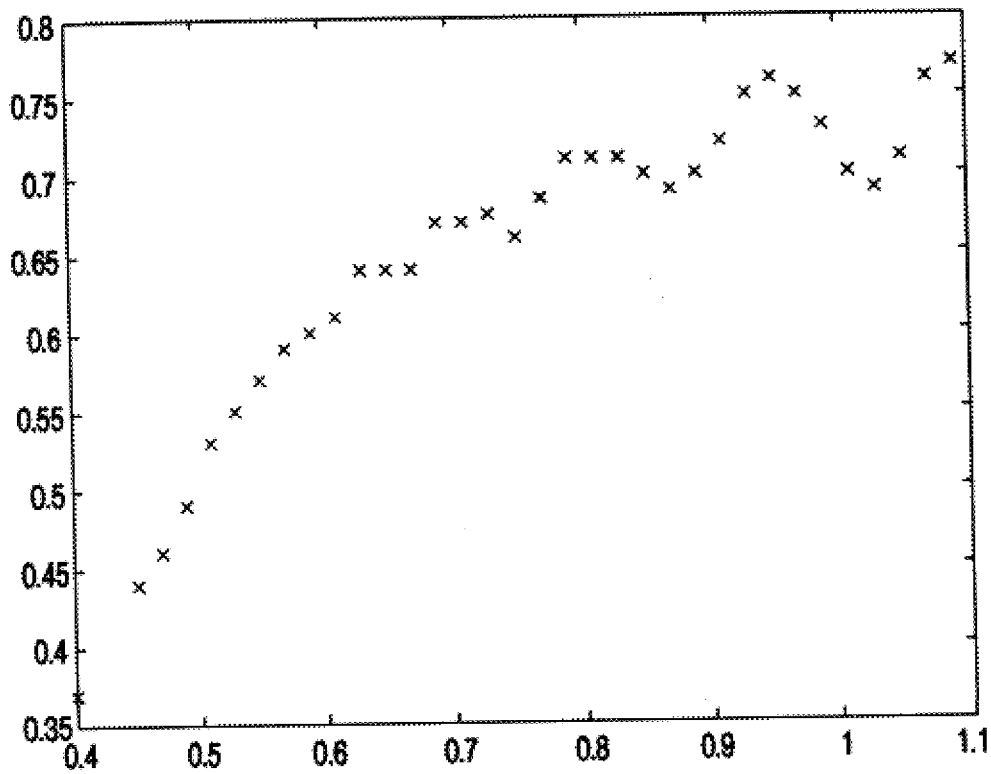
FIG. 3 is a graph optical transmission through the transparent film shown in FIG. 1.

The optical transmission of the film/substrate combination was measured from the near ultraviolet to the near infrared. For these measurements, a monochromator beam approximately 0.4 cm in diameter was incident on the back of the glass substrate and 1-cm diameter detector was located 2 cm from the diamond film. Consequently, light reaching the detector is subject to scatter losses in the film. FIG. 2 shows the optical transmission as a function of wavelength for the transparent film in FIG. 1. The optical interference peak separations indicate a diamond film thickness of approximately 1.18 μm. Transmission values in the red and infrared compare favorably with the ideal value of 75.1% in the absence of interference for a planar, non-absorbing diamond film on the glass substrate, taking the refractive index of diamond as 2.42 and that of the Corning 7059 as 1.53. At smaller wavelengths, the transmission drops, as seen in FIG. 2. Previous studies have indicated that the drop in CVD diamond transmission at smaller wavelengths is due to scattering from grain boundaries (Harris, D. C., Proc. SPIE 2286 218–228 (1994)). A plot of the transmission loss deduced from FIG. 3 versus the inverse of wavelength shows a fourth-law power dependence, indicative of scattering.

Thus continuous diamond films which show good long term adhesion have been deposited on borosilicate glasses. Optical properties are strongly dependent on grain size, with larger grain size diamond films appearing translucent and smaller grain size diamond films appearing transparent.

EXAMPLE 2

This example illustrates adhesion of diamond films on glass after temperature-cycling.

The substrate was CORNING 7059 glass wafer, 2 inches in diameter and 1.1 mm thick. The substrate was seeded by 0.1 micrometer diamond powder suspended in photoresist (SHIPLEY 1813) which was spun onto the wafer. Film deposition was performed in a microwave plasma disk reactor with a 5 inch diameter bell jar at a pressure of 9 torr and with gas flows of 200 sccm hydrogen, 8 sccm carbon dioxide, and 3 sccm methane. Deposition time was 38 hours, the microwave input power was 1000 W, and the substrate temperature as measured with an optical pyrometer was 450° C. The resulting polycrystalline diamond film was continuous as documented by microscopy, and was high-quality diamond as documented by Raman analysis. The average thickness was 1.0 micrometers as determined by weight gain measurements. The sample was heated to a fixed temperature and then cooled to room temperature in a series of experiments. After each experiment, the tape-test was performed. The temperatures to which the sample was heated were 80° C., 125° C. and 210° C. After each experiment, the sample passed the tape-test for adhesion.

EXAMPLE 3

This example illustrates adhesion of diamond films on glass after temperature-cycling for a different gas composition and a different substrate size.

The substrate was CORNING 7059 glass wafer, 3 inches in diameter and 1.1 mm thick. The substrate was seeded by 0.1 micrometer diamond powder suspended in photoresist which was spun onto the wafer. Film deposition was performed in a microwave plasma disk reactor with a 5 inch diameter bell jar at a pressure of 9 torr and with gas flows of 200 sccm hydrogen and 5 sccm methane. Deposition time was 30 hours, the microwave input power was 1000 W, and the substrate temperature as measured with an optical pyrometer was 470° C. The resulting polycrystalline diamond film was continuous as documented by microscopy, and was highquality diamond as documented by Raman analysis. The average thickness was 2.0 micrometers as determined by weight gain measurements. The sample was heated to a fixed temperature and then cooled to room temperature in a series of experiments. After each experiment, the tape test was performed. The temperatures to which the sample was heated were 80° C., 125° C., and 210° C. After each experiment, the sample passed the tape-test for adhesion.

EXAMPLE 4

This example illustrates adhesion of diamond films on glass for a different glass-type.

The substrate was PYREX glass wafer, 2 inches in diameter and 2 mm thick. The substrate was seeded by 0.1 micrometer diamond powder suspended in photoresist SHIPLEY 1813 which was spun onto the wafer. Film deposition was performed in a microwave plasma disk reactor with a 5 inch diameter bell jar at a pressure of 9 torr and with gas flows of 200 sccm hydrogen, 8 sccm carbon dioxide, and 3 sccm methane. Deposition time was 60 hours, the microwave input power was 1000 W, and the substrate temperature as measured with an optical pyrometer was 470° C. The average polycrystalline diamond film thickness was 1.7 micrometers as determined by weight gain measurements. The sample passed the tape-test for adhesion.

EXAMPLE 5

This example illustrates diamond coating of integrated circuit substrates.

The substrate was a silicon wafer, 2 inches in diameter and 0.3 mm thick. The silicon wafer had been photolithographically processed by conventional oxidation, diffusion, and aluminum metallization to contain a variety of test devices including resistors and transistors. Next, the substrate was seeded by 0.1 micrometer diamond powder suspended in photoresist SHIPLEY 1813 which was spun onto the wafer. Film deposition was performed in a microwave plasma disk reaction with a 4 inch diameter bell jar at a pressure of 7 torr and with gas flows of 200 sccm hydrogen, 8 sccm carbon dioxide and 3 sccm methane. Deposition time was 40 hours, the microwave input power was 330 W, and the substrate temperature as measured with an optical pyrometer was 435° C. The resulting polycrystalline diamond film was continuous as documented by microscopy. The average thickness was 0.67 micrometers as determined by weight gain measurements. Diamond etching using an oxygen/argon SF6 plasma known in the art was used to expose the device testing pads. The diamond coated resistors and bipolar junction transistors were tested subsequent to this etching procedure and found to be fully functional. The aluminum lines and oxides of various thicknesses and colors which were associated with the underlying electronic devices were clearly visible through the transparent diamond film and were undamaged as assessed by microscopy.

Silicon integrated circuits consist of a variety of materials including silicon, silicon dioxide, and aluminum based metal layer. These represent a wide variety of thermal expansion coefficients and whereas diamond deposition on silicon is well established, deposition on metals and oxides can be problematic. An upper limit on deposition temperature is imposed by the presence of aluminum which has a melting temperature of 660° C. Lower substrate temperatures are advantageous in that differing thermal expansion coefficients can cause considerable intrinsic stress as the substrate and film are cooled from the deposition temperature. Consequently, low-temperature diamond deposition using microwave plasma-assisted chemical vapor deposition was used.

Silicon substrates with (100) orientation were processed to fabricate resistors and bipolar junction transistors. Boron diffusion through oxide windows were used to form diffused resistors and p-type base regions for the transistors. A subsequent phosphorus diffusion was used to form the n-type emitter regions for the transistors, and ohmic contacts to the n-type collectors. Contact cuts were made to the underlying silicon and aluminum was deposited by thermal evaporation. The aluminum layer was patterned and etched by conventional photolithography to form contact pads for device testing purposes. An oxide passivation layer was not used.

Because abrasive seeding techniques can damage the delicate metallization patterns, a spin-on seeding method was used (Masood, A., et al., J. Electrochem. Soc. 138 L67–L68 (1991)). Diamond powder, 0.1 $\mu$m, was suspended in photoresist as described in Masood et al and spun onto the wafer. During the first few minutes of exposure to the deposition plasma, the photoresist is etched away, allowing the diamond seed particles to be distributed on the wafer.

Figure 4:
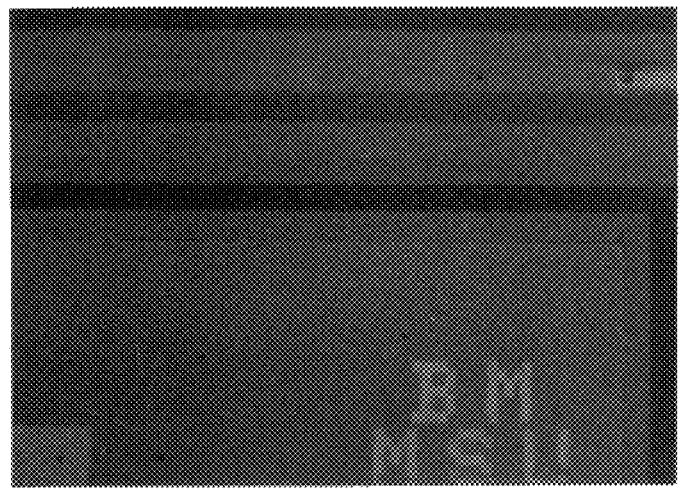
FIG. 4 is an optical micrograph of a detail of the diamond film coated IC structure. The lightest colored patterns correspond to aluminum metallization.
Figure 5A:
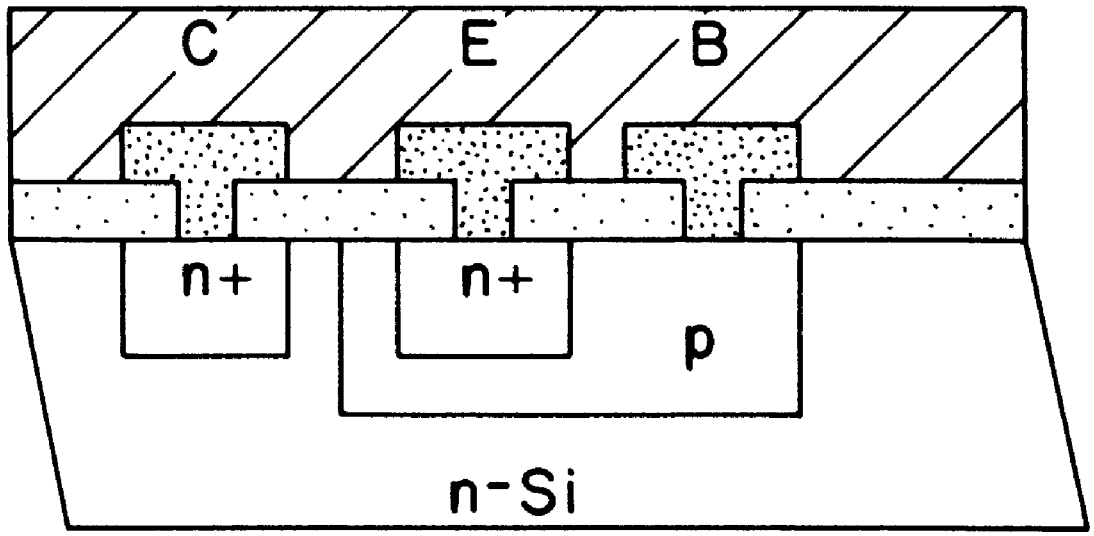
FIGS. 5A and 5B are cross-sectional drawings of a diamond coated bipolar junction transistor with collector (C), emitter (E), and base (B), and a diffused resistor. Solid black is aluminum, dotted gray is oxide and cross-hatched is diamond.
Figure 5B:
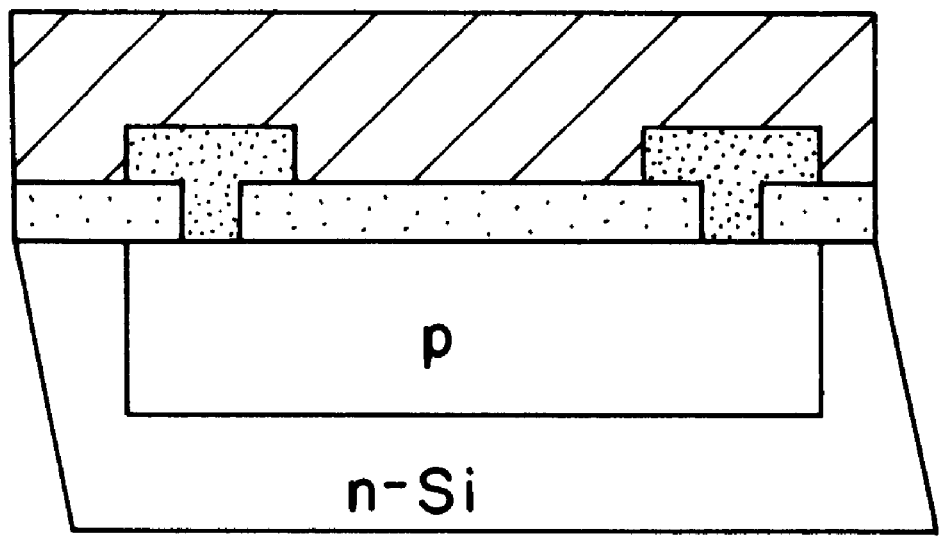

FIG. 4 shows a 100× optical micrograph view of details of the IC structure beneath the transparent diamond film. Higher magnification shows the diamond film to be continuous and polycrystalline. The lightest features in FIG. 4 correspond to aluminum patterns which are 20 $\mu$m wide. The other varying patterns correspond to oxide layers of different thickness. FIGS. 5A and 5B show cross-sectional drawings through the contact cuts of a resistor and a bipolar transistor. As measured by optical pyrometry, the substrate temperature during deposition was approximately 435° C. Based on before and after weight gain measurements, the diamond film thickness is approximately 0.7 $\mu$m.

In order to test the devices after diamond coating, the diamond was selectively removed from the metal contact pads by plasma etching. Previous reports of the selective etching of diamond have included the use of evaporated aluminum (Joseph A., et al., 2nd International Conference on the Applications of Diamond Films and Related Materials, Eds. M. Yoshikawa, et al., 429–432 MYU Tokyo (1993)) and sputtered silicon dioxide (Grot, S. A., et al., "Diamond Thin-Film Recessed Gate Field-Effect Transistors Fabricated by Electron Cyclotron Resonance Plasma Etching (IEEE EDL 13, 462–464 (1992)) as masking layers. In this investigation, spin-on-glass (SOG) was used as the masking layer. The SOG was patterned by photoresist and wet etching, the photoresist was stripped, and the diamond was etched through to the aluminum test pads. Diamond etching was achieved in an ECR plasma discharge using a mixture of gases including oxygen/argon/SF6. Diamond film coated resistors and transistors were tested subsequent to this etching procedure and found to be fully functional. Alternatively, the photoresist may be patterned prior to deposition. As noted in Masood et al, such seeding is not present where the diamond film is not desired.

Diamond over-coatings are of interest for microelectronics because of potential applications for passivation and reduction of local hot spots. In this Example 5, diamond films have been deposited on silicon integrated circuit structures including transistors and resistors. The deposition temperature is sufficiently low so as to not cause damage to the underlying structures, including the aluminum metallization.

EXAMPLE 6

This example illustrates achievement of a high degree of optical transparency for diamond film on glass.

The substrate was CORNING 7059 glass wafer, 2 inches in diameter and 1.1 mm thick. The substrate was seeded by polishing with 0.1 micrometer diamond powder and then cleaned. Film deposition was performed in a microwave plasma disk reactor with a 5 inch diameter bell jar at a pressure of 9 torr and with gas flows of 200 sccm hydrogen, 8 sccm carbon dioxide, and 3 sccm methane. Deposition time was 30 hours, the microwave input power was 1000 W, and the substrate temperature as measured with an optical pyrometer was 470° C. The resulting polycrystalline diamond film was continuous as documented by microscopy, and was high-quality diamond as documented by Raman analysis. The average thickness was 0.6 micrometers as determined by weight gain measurements.

The seeding method produces a high seeding density such that the average grain size as determined by scanning electron microscopy is approximately 0.3 micrometers, resulting in an optically smooth film. Optical transmission was measured with a 0.5 mm diameter HeNe laser beam incident on the back of the glass substrate and a 1 cm diameter detector directly adjacent to the diamond film. The percent transmission was 70%. This is appreciably larger than that measured with larger grain size films (greater than one micrometer grain size) for which the percent transmission is 30%. As a point of reference, calculations based on refractive indices for a perfect planar, non-absorbing diamond film on CORNING 7059 glass, yield a percent transmission of 75% based on reflection at the air/glass; glass/diamond; diamond/air interfaces.

EXAMPLE 7

This example illustrates the effect of substrate bias on diamond film morphology.

The substrate was a silicon wafer, 2 inches in diameter and 0.3 mm thick. The substrate was seeded by 0.1 micrometer diamond powder suspended in photoresist which was spun onto the wafer. Film deposition was performed in a microwave plasma disk reactor with a 5 inch diameter bell jar at a pressure of 15 torr and with gas flows of 200 sccm hydrogen, 8 sccm carbon dioxide and 3 sccm methane. Deposition time was 40 hours, the microwave input power was 1000 W, and the substrate temperature as measured with an optical pyrometer was 510° C. The substrate was biased with 100 volts positive dc voltage with a resulting bias current of 8 mA by being placed on a graphite susceptor. The average thickness was 2.2 micrometers as determined by weight gain measurements. The resulting weight gain is comparable to that achieved with no-bias growth conditions, however scanning electron microscopy shows that the film resulting from deposition on a biased substrate exhibits diamond grains which are more clearly faceted than for films produced on non-biased substrates.

As can be seen from Examples 1 to 7, the process of the present invention provides clear and adherent films on silicon containing materials. This result is achieved because of the unique set of processing conditions.

It is intended that the foregoing description be only illustrative of the present invention and that the present invention be limited only by the hereinafter appended claims.

We claim:

1. In a method for depositing an adherent diamond thin film on a borosilicate glass substrate by chemical vapor deposition from a plasma, the improvement which comprises:
    (a) positioning the substrate which has been polished with diamond particles or uniformly coated with diamond particles between about 0.05 and 1 micron in width adjacent to the plasma for deposition of the diamond thin film; and
    (b) creating and maintaining the plasma under reducing conditions in a microwave cavity during the depositing which plasma contacts the substrate at a temperature of the substrate which leaves the substrate undamaged of less than 600° C. from a mixture of gases consisting essentially of hydrogen, and methane at mole ratios for hydrogen of 0.90 to 0.99, and for methane of 0.01 to 0.05, at a pressure of between 1 and 15 torr for 5 to 60 hours to deposit the diamond thin film on the substrate which is 0.5 to 3.0 $\mu$M thick, wherein the diamond thin film is adherent to the substrate and transparent and exhibits a transparency between 70 to 75.1 percent on the borosilicate glass and has a Raman spectrum peak at 1332 $cm^{-1}$ so that the substrate is visible through the film.

2. A method for depositing an adherent diamond thin film on a borosilicate glass substrate comprising:
    (a) positioning the substrate which has been polished with diamond particles or uniformly coated with diamond particles between 0.05 to 1 micron in width adjacent the plasma for deposition of the diamond thin film; and
    (b) creating and maintaining a plasma under reducing conditions in a microwave cavity during the depositing which plasma contacts the substrate at a temperature of the substrate which leaves the substrate undamaged of 350–500° C. from a mixture of gases consisting essentially of hydrogen, and methane at mole ratios for hydrogen of 0.90 to 0.99, and for methane 0.01 to 0.05 at a pressure of between 1 and 15 torr for 5 to 60 hours to deposit the diamond thin film on the substrate which is 0.5 to 3.0 $\mu$M thick, wherein the diamond thin film is adherent to the substrate, and transparent and exhibits a transparency between 70 and 75.1 percent on the borosilicate glass and a Raman spectrum peak at 1332 $cm^{-1}$ so that the substrate is visible through the film.

3. The method of claim 2 wherein a microwave is selected from the group consisting of 2.45 GHz and 915 MHz is used to produce the plasma.

4. The method of any one of claims 1 or 2 wherein a positive electrical bias is continuously applied to the substrate.

5. The method of claim 2 wherein the particles of diamond are coated on the substrate in a photoresist composition.

6. The method of claim 2 wherein the diamond particles are used to polish the substrate.

7. The method of any one of claims 1 or 2 wherein the substrate is with electrical circuity which is covered by the diamond thin film.

* * * * *